United States Patent
Hsu et al.

(10) Patent No.: US 9,991,303 B2
(45) Date of Patent: Jun. 5, 2018

(54) IMAGE SENSOR DEVICE STRUCTURE

(71) Applicant: TAIWAN SEMICONDUCTOR MANUFACTURING CO., LTD., Hsin-Chu (TW)

(72) Inventors: Hung-Wen Hsu, Tainan (TW); Ching-Chung Su, Tainan (TW); Cheng-Hsien Chou, Tainan (TW); Jiech-Fun Lu, Tainan (TW); Shih-Pei Chou, Tainan (TW); Yeur-Luen Tu, Taichung (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days. days.

(21) Appl. No.: 14/658,465

(22) Filed: Mar. 16, 2015

(65) Prior Publication Data
US 2016/0276386 A1 Sep. 22, 2016

(51) Int. Cl.
*H01L 27/146* (2006.01)

(52) U.S. Cl.
CPC .... *H01L 27/14623* (2013.01); *H01L 27/1462* (2013.01); *H01L 27/1463* (2013.01); *H01L 27/14621* (2013.01); *H01L 27/14627* (2013.01); *H01L 27/14687* (2013.01); *H01L 27/14689* (2013.01)

(58) Field of Classification Search
CPC .................................................. H01L 27/14623
See application file for complete search history.

(56) References Cited

U.S. PATENT DOCUMENTS

| | | | | |
|---|---|---|---|---|
| 8,207,590 B2* | 6/2012 | Park | ................ | H01L 27/14621 257/444 |
| 2006/0220025 A1* | 10/2006 | Oh | .................... | H01L 27/14609 257/72 |
| 2007/0080419 A1* | 4/2007 | Shizukuishi | ...... | H01L 27/14623 257/462 |
| 2010/0059840 A1* | 3/2010 | Yun | ................... | H01L 27/14636 257/432 |
| 2010/0201834 A1* | 8/2010 | Maruyama | .......... | H01L 27/1464 348/222.1 |
| 2011/0006387 A1* | 1/2011 | Katsuno | ............ | H01L 27/14625 257/433 |
| 2012/0050600 A1* | 3/2012 | Ahn | .................... | H01L 27/1464 348/336 |
| 2012/0242874 A1* | 9/2012 | Noudo | ................ | H01L 27/1464 348/294 |
| 2013/0001724 A1* | 1/2013 | Masuda | ............ | H01L 27/14623 257/432 |

(Continued)

*Primary Examiner* — Su C Kim
*Assistant Examiner* — David S Wilbert
(74) *Attorney, Agent, or Firm* — Birch, Stewart, Kolasch & Birch, LLP

(57) ABSTRACT

An image sensor structure is provided. The image sensor device structure includes a substrate, and the substrate includes an array region and a peripheral region. The image sensor device structure includes an anti-reflection layer formed on the substrate and a buffer layer formed on the anti-reflection layer. The image sensor device structure includes a first etch stop layer formed on the buffer layer and a metal grid structure formed on the first etch stop layer. The image sensor device structure also includes a dielectric layer formed on the metal grid structure.

19 Claims, 18 Drawing Sheets

(56) References Cited

U.S. PATENT DOCUMENTS

| | | | |
|---|---|---|---|
| 2013/0307103 A1* | 11/2013 | Lin | H01L 27/14621 257/432 |
| 2014/0054662 A1 | 2/2014 | Yanagita et al. | |
| 2014/0061839 A1 | 3/2014 | Ting et al. | |
| 2014/0263956 A1* | 9/2014 | Jian | H01L 27/1463 250/208.1 |
| 2015/0035109 A1* | 2/2015 | Kataoka | H01L 27/14634 257/443 |
| 2015/0084144 A1* | 3/2015 | Suzuki | H01L 27/1463 257/432 |
| 2015/0091121 A1* | 4/2015 | Manda | H01L 27/14621 257/443 |
| 2015/0303233 A1* | 10/2015 | Borthakur | H01L 27/14636 348/273 |

\* cited by examiner

IMAGE SENSOR DEVICE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

An image sensor is used to convert an optical image focused on the image sensor into an electrical signal. The image sensor includes an array of light-detecting elements, such as photodiodes, and a light-detecting element is configured to produce an electrical signal corresponding to the intensity of light impinging on the light-detecting element. The electrical signal is used to display a corresponding image on a monitor or provide information about the optical image.

Although existing image sensor device structures and methods for forming the same have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
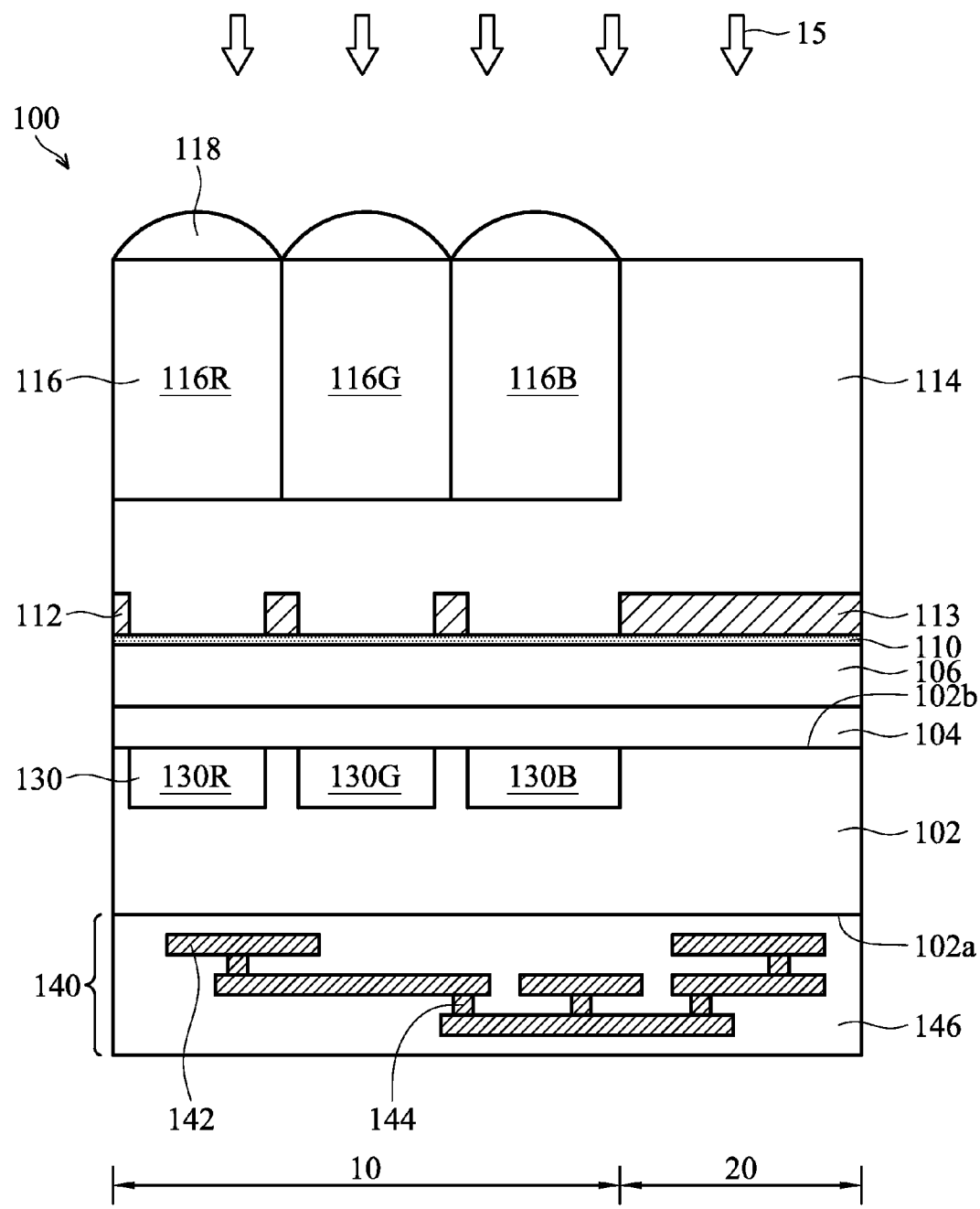
FIG. 1 shows a cross-sectional representation of an image sensor device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming an image sensor device structure are provided. FIG. 1 shows a cross-sectional representation of an image sensor device structure 100, in accordance with some embodiments of the disclosure.

The image sensor device structure 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The substrate 102 includes an array region 10 and a peripheral region 20. The array region 10 is also called active image sensor pixel region, and the peripheral region 20 is also called black reference pixel region. The peripheral region 20 is configured to detect a black level for an image detected by the photodiode array.

The sensing elements 130R, 130G and 130B are formed in the substrate 102 in the array region 10. The sensing elements 130R, 130G and 130B are used to detect the intensity (brightness) of red, green and blue light wavelengths, respectively. The sensing elements 130R, 130G and 130B may include doped regions having n-type and/or p-type dopants in the substrate 102. The sensing elements 130R, 130G and 130B further includes various transistors, such as a transfer transistor (not illustrated), a reset transistor (not illustrated), a source-follower transistor (not illustrated), a select transistor (not illustrated), other suitable transistors, or combinations thereof.

The substrate 102 has a front side 102a and a back side 102b. An interconnect structure 140 is formed on the front side 102a of the substrate 102. In some embodiments, interconnect structure 140 includes conductive features 142 and contact plugs 144. Conductive features 142 are embedded in an insulating material 146. The interconnect structure 140 is formed in a back-end-of-line (BEOL) process in some embodiments. The conductive features 142 are made of conductive materials, such as copper, copper alloy, aluminum, aluminum alloys, or combinations thereof. In some embodiments, the contact plugs 144 are made of conductive materials, such as copper (Cu), copper alloy, aluminum (Al), aluminum alloys, or combinations thereof. In some embodiments, conductive features 142 include multi-layers made of various materials, such as a plurality of metallization structures.

In some embodiments, the insulating material 146 is made of silicon oxide. In some embodiments, the insulating material 146 includes multiple dielectric layers of dielectric materials. In some embodiments, a top dielectric layer of the multiple dielectric layers is made of $SiO_2$. The interconnect structure 140 shown is merely for illustrative purposes. The interconnect structure 140 may include other configurations and may include one or more conductive lines and via layers.

The substrate 102 may include isolation features (not shown), such as shallow trench isolation (STI) features or local oxidation of silicon (LOCOS) features. The isolation features may define and isolate various integrated circuit devices.

An anti-reflection (ARC) layer 104 is formed on the back-side 102b of the substrate 102. In some embodiments, the ARC layer 104 is made of silicon oxynitride (SiON), silicon rich oxide, silicon oxycarbide (SiOC) or combinations thereof.

A buffer layer 106 is formed on the ARC layer 104. The buffer layer 106 is made of silicon nitride (SiN), silicon carbide (SiC), silicon carbon nitride (SiCN), hafnium oxide ($HfO_2$), titanium dioxide ($TiO_2$) or combinations thereof.

An etch stop layer 110 is formed on the buffer layer 106. The etch stop layer 110 is used to stop the etching process. The etch stop layer 110 should be made of transparent materials, and therefore the light may pass through the etch stop layer 110. The etch stop layer 110 is used to stop the etching process, and therefore the buffer layer 106 below the etch stop layer 110 may not be etched. In some embodiments, the etching selectivity of the metal material (formed later) to the etch stop layer 110 is in a range from about 8 to about 15. It should be noted that etch-stop effect of the silicon nitride is insufficient, because the etching selectivity of the metal material to the silicon nitride is lower than 5. In addition, the silicon nitride is not transparent.

If no etch stop layer is formed on the buffer layer 106, a portion of the buffer layer 106 is etched by the etching process. Therefore, the surface roughness of the buffer layer 106 is high. In contrast, when the etch stop layer 110 is formed on the buffer layer 106, the surface roughness of the buffer layer 106 is reduced.

In addition, if no etch stop layer is formed on the buffer layer 106, the thickness of the buffer layer 106 in the array region 10 and that in the peripheral region 20 may be different. In other words, the uniformity of the thickness of the buffer layer 106 is poor. In contrast, when the etch stop layer 110 is formed on the buffer layer 106, the uniformity of the thickness of the buffer layer 106 is maintained at a predetermined value without being etched by the etching process. Once the thickness of the buffer layer 106 is controlled well, the performance of the image sensor device structure 100 is improved.

In some embodiments, the etch stop layer 110 is made of aluminum oxide ($Al_2O_3$), zirconium oxide ($ZrO_2$), yttrium oxide ($Y_2O_3$) or combinations thereof. In some embodiments, the etch stop layer 110 has a thickness in a range from about 100 nm to about 500 nm.

A number of metal grid structures 112 are formed on the etch stop layer 110 in the array region 10. The metal grid structures 112 are used to guide light towards corresponding sensing elements 130R, 130G and 130B. The metal grid structures 112 are made of materials having a reflective property, which makes them capable of reflecting light. In some embodiments, the metal grid structures 112 are made of copper (Cu), tungsten (W), aluminum (Al), or another metal material.

A metal shield structure 113 is formed on the etch stop layer 110 in the peripheral region 20. The metal shield structure 113 is configured to reflect light away from the calibration region (not shown) which is formed in the substrate 102 in the peripheral region.

A dielectric layer 114 is formed on the metal grid structures 112 and metal shield structure 113. The dielectric layer 114 is made of silicon nitride, silicon oxynitride, silicon oxide or combinations thereof. The dielectric layer 114 may have a single layer or multiple layers.

A number of color filters 116 are formed in the dielectric layer 114. Each of the metal grid structures 112 is formed below an interface region between two adjacent color filters 116. The color filter 116R aligned with the sensing elements 130R is configured to filter visible light and allow light in the red wavelength to pass through to the sensing elements 130R. The color filter 116G aligned with the sensing elements 130G is configured to filter visible light and allow light in the green wavelength to pass through to the sensing elements 130G. The color filter 116B aligned with the sensing elements 130B is configured to filter visible light and allow light in the blue wavelength to pass through to the sensing elements 130B.

The color filters 116 are made of dye-based (or pigment-based) polymer for filtering out a specific frequency band (for example, a desired wavelength of light). In some other embodiments, the color filters 116 are made of resins or other organic-based materials having color pigments.

A number of lens structures 118 are formed over the color filters 116. The lens structures 118 may have a variety of shapes and sizes depending on the index of refraction of the material used for the lens structures 118.

A light 15 is disposed over the back side 102b of the substrate 102. The lens structures 118 direct the light 15 to the respective color filters 116. Then, the light 15 passes through the color filters 116 to the corresponding sensing elements 130R, 130G, 130B.

Figure 2:
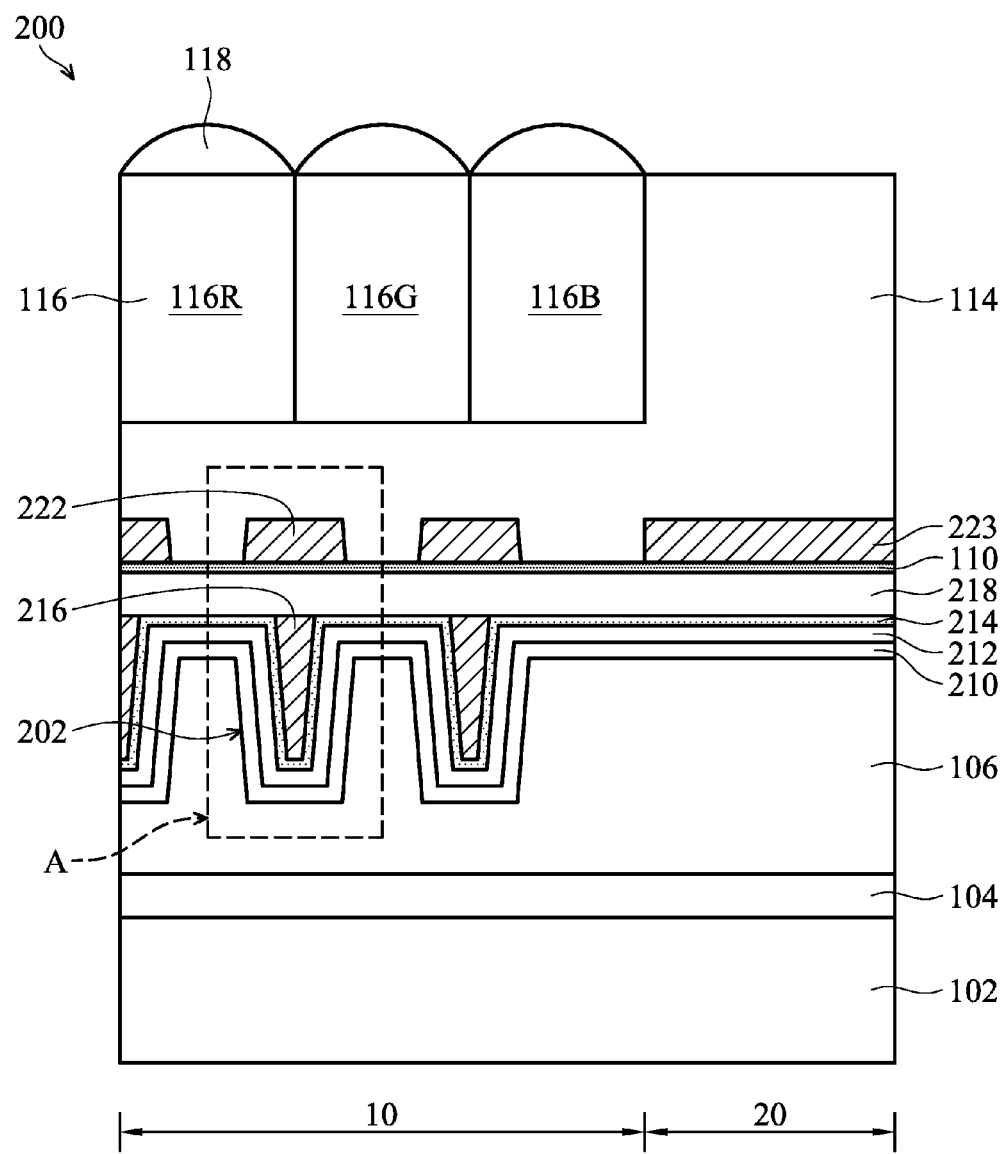
FIG. 2 shows a cross-sectional representation of an image sensor device structure, in accordance with some embodiments of the disclosure.

FIG. 2 shows a cross-sectional representation of an image sensor device structure 200, in accordance with some embodiments of the disclosure. FIG. 2 is similar to FIG. 1. The difference between FIG. 2 and FIG. 1 is that a deep trench (DT) structure 202 is formed in the buffer layer 106 in FIG. 2.

The deep trench (DT) structure 202 is constructed by a first insulating layer 210, a second insulating layer 212, an etch stop layer 214, and a buried metal structure 216. The buried metal structure 216 is surrounded by the etch stop layer 214. In addition, a third insulating layer 218 is formed between the etch stop layer 214 and the etch stop layer 110.

FIG. 3A-3I show cross-sectional representations of forming an image sensor device structure of the region A of FIG. 2, in accordance with some embodiments of the disclosure.

Figure 3A:
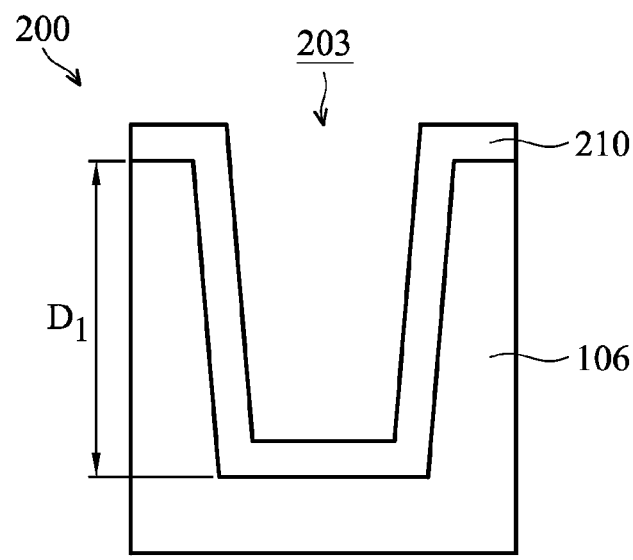
FIG. 3A-3I show cross-sectional representations of forming an image sensor device structure of FIG. 2, in accordance with some embodiments of the disclosure.

Referring to FIG. 3A, a trench 203 is formed in the buffer layer 106. The trench 203 is formed by an etching process, such as a dry etching process or wet etching process. Afterwards, the first insulating layer 210 is conformally formed in the trench 203. In some embodiments, the first insulating layer 210 is made of silicon oxide, silicon nitride, silicon oxynitride, or combinations thereof.

In some embodiments, the trench 203 has a depth $D_1$ in a range from about 200 nm to about 1500 nm. If the depth $D_1$ is too large, the damage recovering and film gap-fill capability should be concerned. If the depth $D_1$ is too small, the shielding effect of the buried metal structure (formed later) may be not good enough.

Figure 3B:
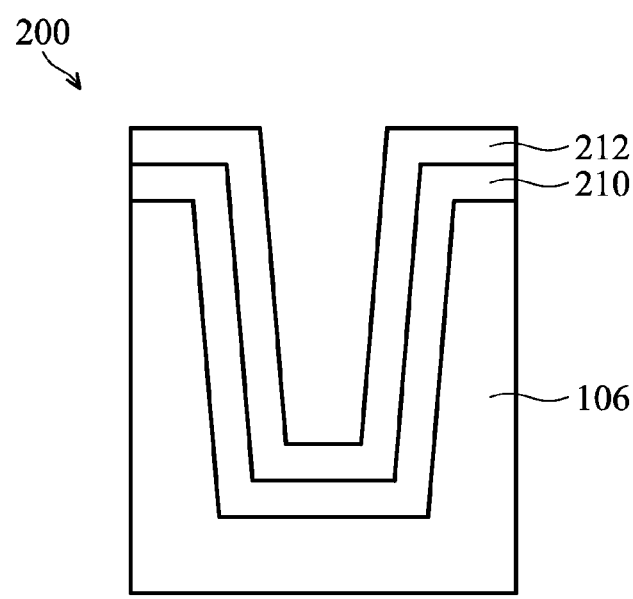

After the first insulating layer 210 is formed, the second insulating layer 212 is formed on the first insulating layer 210 as shown in FIG. 3B, in accordance with some embodiments of the disclosure. In some embodiments, the second insulating layer 212 is made of silicon oxide, silicon nitride, silicon oxynitride, or combinations thereof. In some embodiments, the first insulating layer 210 and the second insulating layer 212 are made of the same material.

Figure 3C:
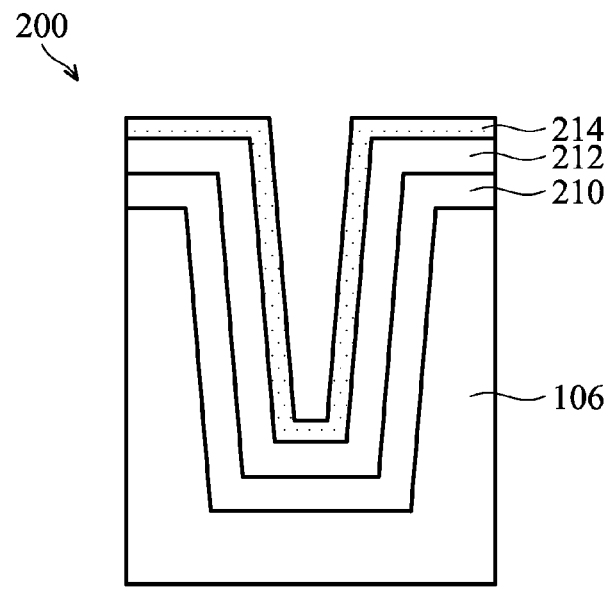

After the second insulating layer 212 is formed, the etch stop layer 214 is formed on the second insulating layer 212 as shown in FIG. 3C, in accordance with some embodiments of the disclosure. It should be noted that the etch stop layer 214 lines the sidewalls and the bottom portion of the trench 203, but the trench 203 is not completely filled with the etch stop layer 214.

Figure 3D:
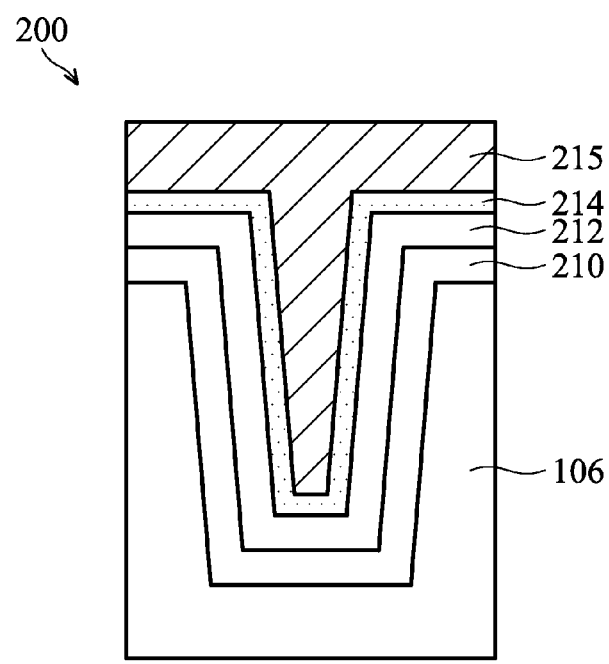

After the etch stop layer 214 is formed, a metal material 215 is formed in the trench 203 and on the etch stop layer 214 as shown in FIG. 3D, in accordance with some embodiments of the disclosure.

Figure 3E:
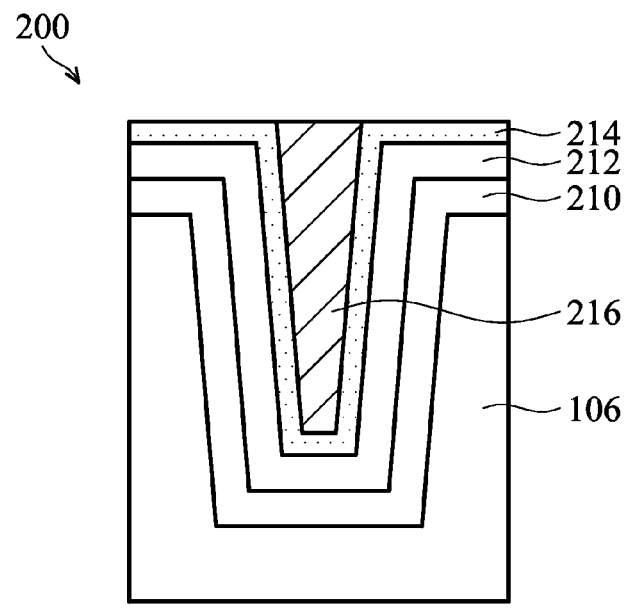
Figure 3F:
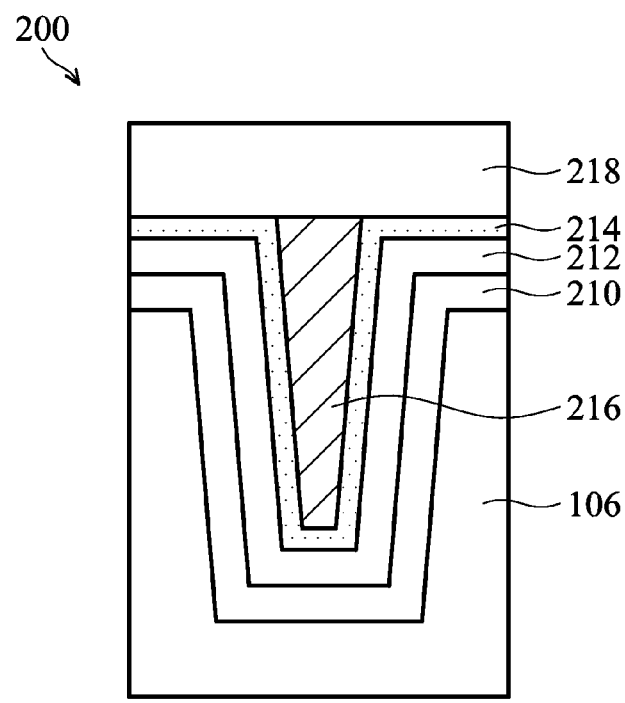

After the metal material 215 is formed, a portion of metal material 215 is removed to form the buried metal structure 216 in the trench 203 as shown in FIG. 3E, in accordance with some embodiments of the disclosure. The portion of metal material 215 is removed by an etching back process.

It should be noted that if no etch stop layer is formed on the second insulating layer 212 and the first insulating layer 210, the second insulating layer 212 and the first insulating layer 210 may be damaged by the etching back process. Once the second insulating layer 212 is damaged, the surface roughness of the second insulating layer 212 is increased. As a result, the performance of the image sensor device structure 200 is degraded. In addition, the thickness of the second insulating layer 212 is reduced, and the light path for passing the second insulating layer 212 is reduced. As a result, the performance of the image sensor device structure 200 is degraded.

In order to protect the second insulating layer 212 from being etched or damaged, the etch stop layer 214 is formed over the second insulating layer 212. Therefore, the surface roughness of the second insulating layer 212 is reduced, and the uniformity of the thickness of the second insulating layer 212 is improved. Therefore, the performance is improved.

After the etching back process, the third insulating layer 218 is formed on the etch stop layer 214. In some embodiments, the third insulating layer 218 is made of silicon oxide, silicon nitride, silicon oxynitride, or combinations thereof.

Figure 3G:
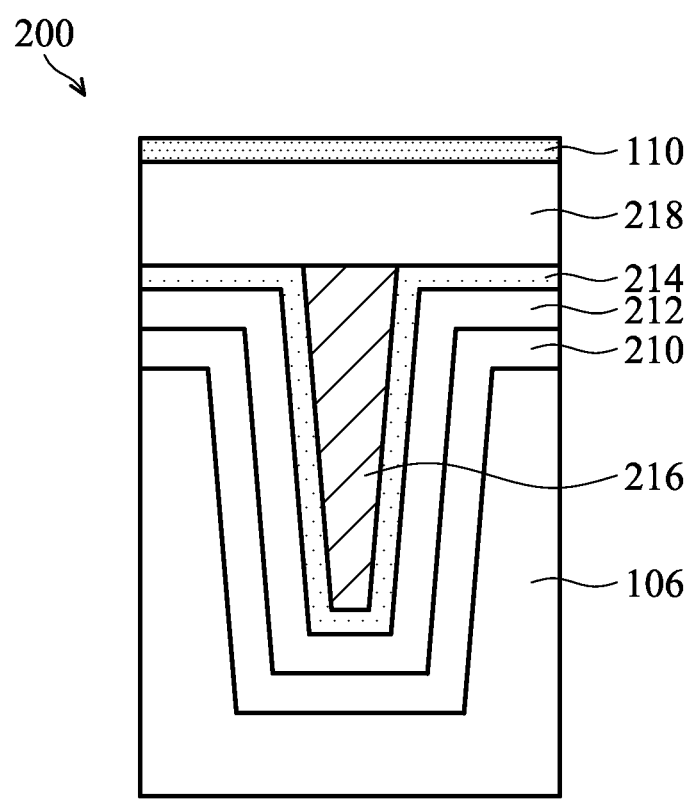

After the third insluting layer 218 is formed, the etch stop layer 110 is formed on the third insluting layer 218 as shown in FIG. 3G, in accordance with some embodiments of the disclosure.

Figure 3H:
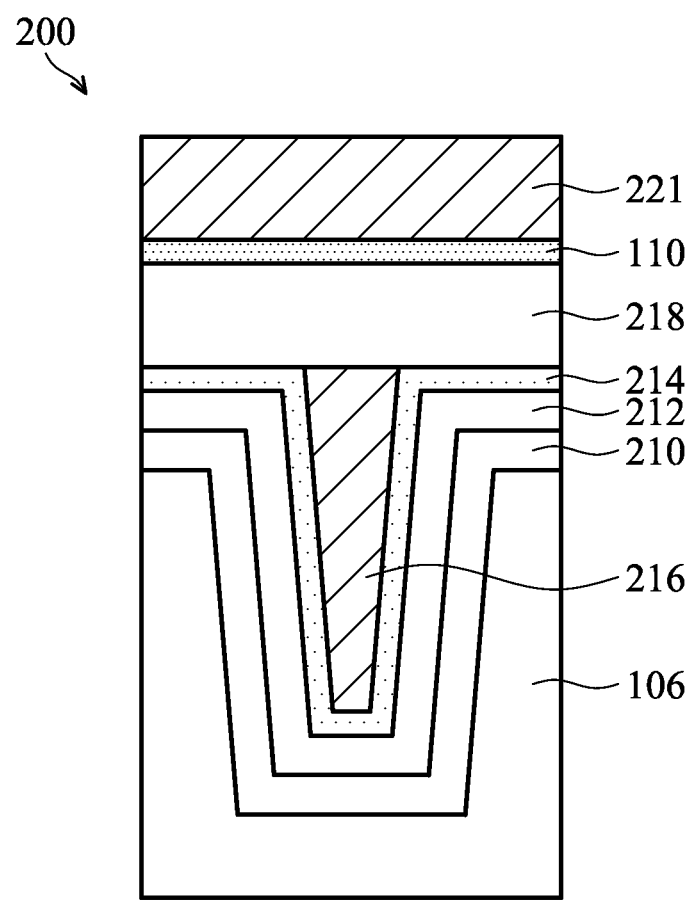
Figure 3:
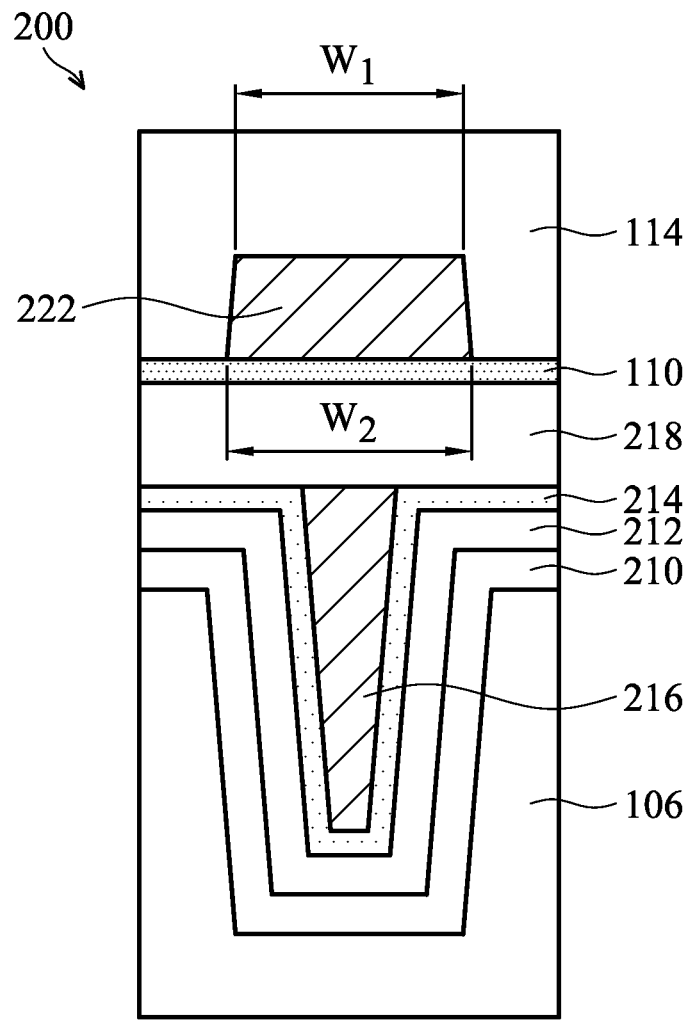

After the etch stop layer 110 is formed, a metal material 221 is formed on the etch stop layer 110 as shown in FIG. 3H, in accordance with some embodiments of the disclosure. In some embodiments, the metal material 221 is made of copper (Cu), tungsten (W), o aluminum (Al) or another metal material.

Afterwards, the metal material 221 is patterned to form a metal grid structure 222 as shown in FIG. 3I, in accordance with some embodiments of the disclosure. In addition, the metal material 221 is also formed on the etch stop layer 110 in the peripheral region 20 to form a metal shield structure 113 (shown in FIG. 2).

The metal material 221 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

As shown in FIG. 3I, the metal grid structure 222 has a trapezoidal structure and has a top surface and a bottom surface. The top surface has a first width $W_1$, and the bottom surface has a second width $W_2$. The second width $W_2$ is wider than the first width $W_1$. In some other embodiments, the metal grid structure 222 has a rectangular structure. Compared with the metal grid structure 222 having a rectangular structure, the metal grid structure 222 having a trapezoidal structure has an advantage in that the buried metal structure 216 under the metal grid structure 222 is completely covered. The metal grid structure 222 is aligned with the buried metal structure 216.

Afterwards, the dielectric layer 114 is formed on the metal grid structures 112 and metal shield structure 113. The dielectric layer 114 is made of silicon nitride, silicon oxynitride, silicon oxide or combinations thereof. The dielectric layer 114 may have a single layer or multiple layers.

Figure 4:
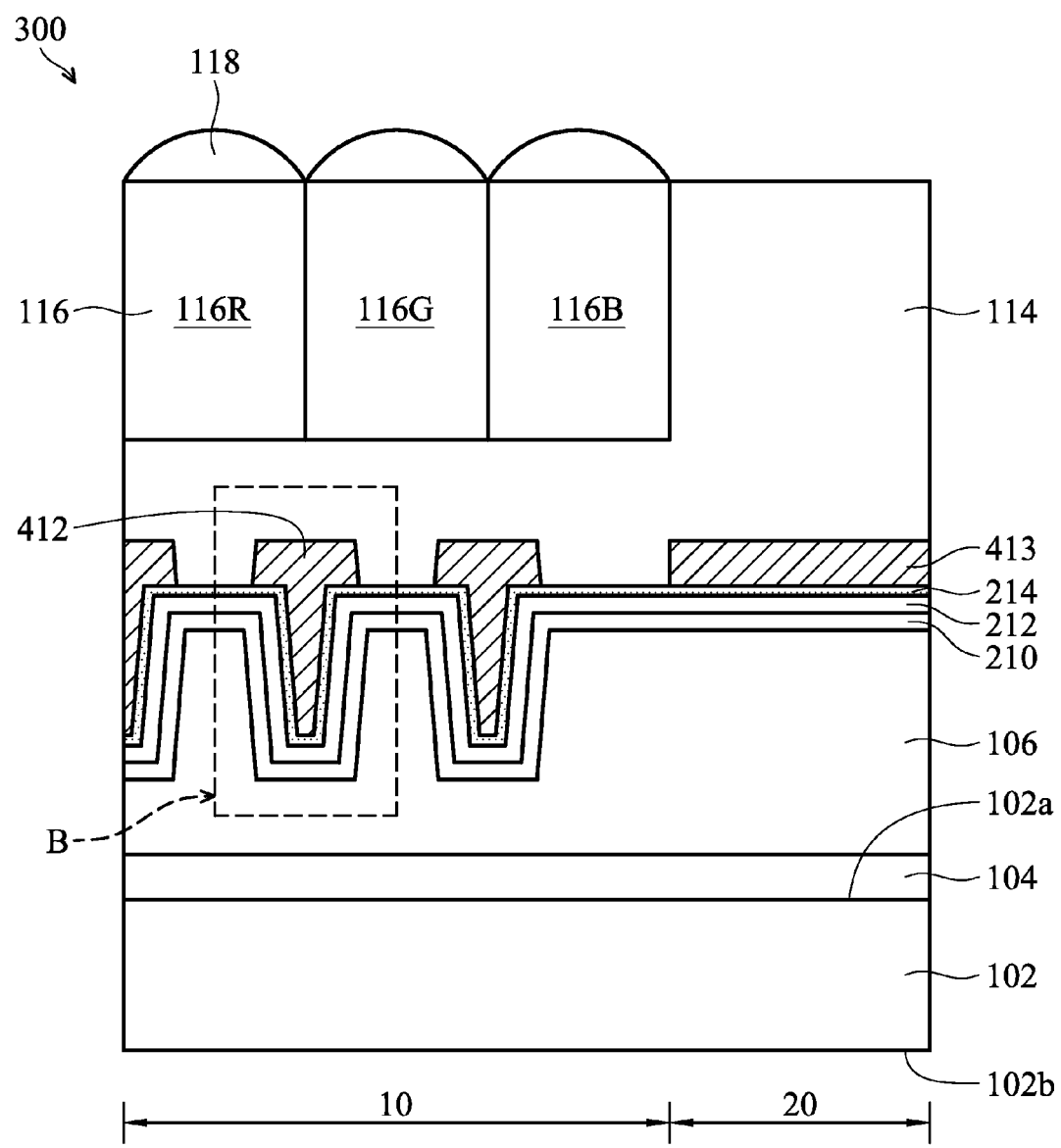
FIG. 4 shows a cross-sectional representation of an image sensor device structure, in accordance with some embodiments of the disclosure.

FIG. 4 shows a cross-sectional representation of an image sensor device structure 300, in accordance with some embodiments of the disclosure. FIG. 4 is similar to FIG. 2, the difference between FIG. 4 and FIG. 2 is that the metal grid structures 412 are formed in a trench structure 203 (referring to FIG. 5A) and extends from the trench structure 203 to above the buffer layer 106. As shown in FIG. 4, the metal grid structures 412 are formed in the array region 10, and a metal shield structure 413 is formed in the peripheral region 20.

Figure 5A:
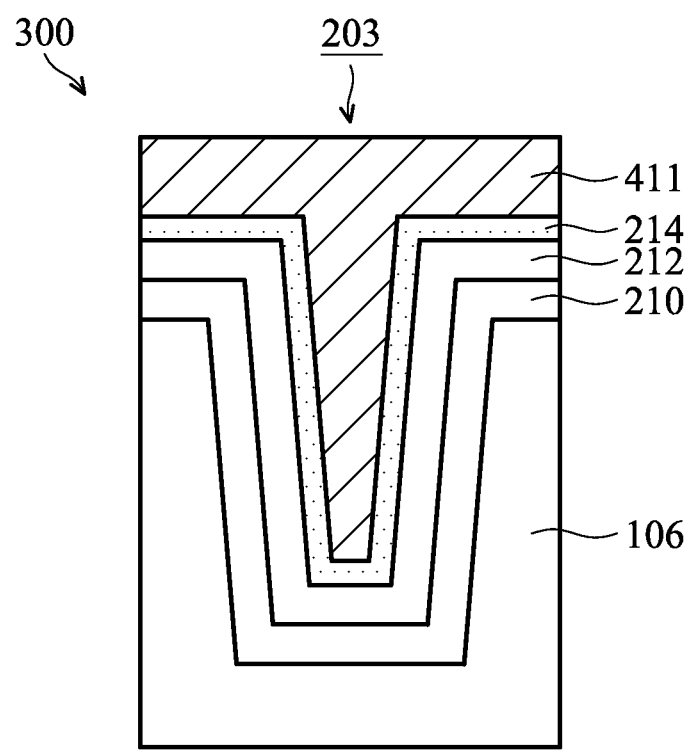
FIG. 5A-5C show cross-sectional representations of forming an image sensor device structure of FIG. 4, in accordance with some embodiments of the disclosure
Figure 5B:
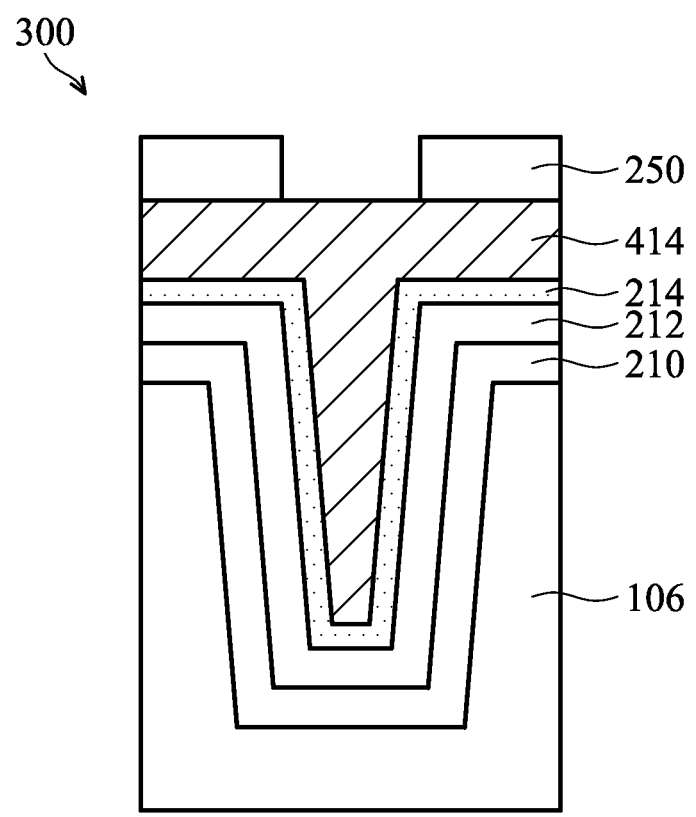
Figure 5C:
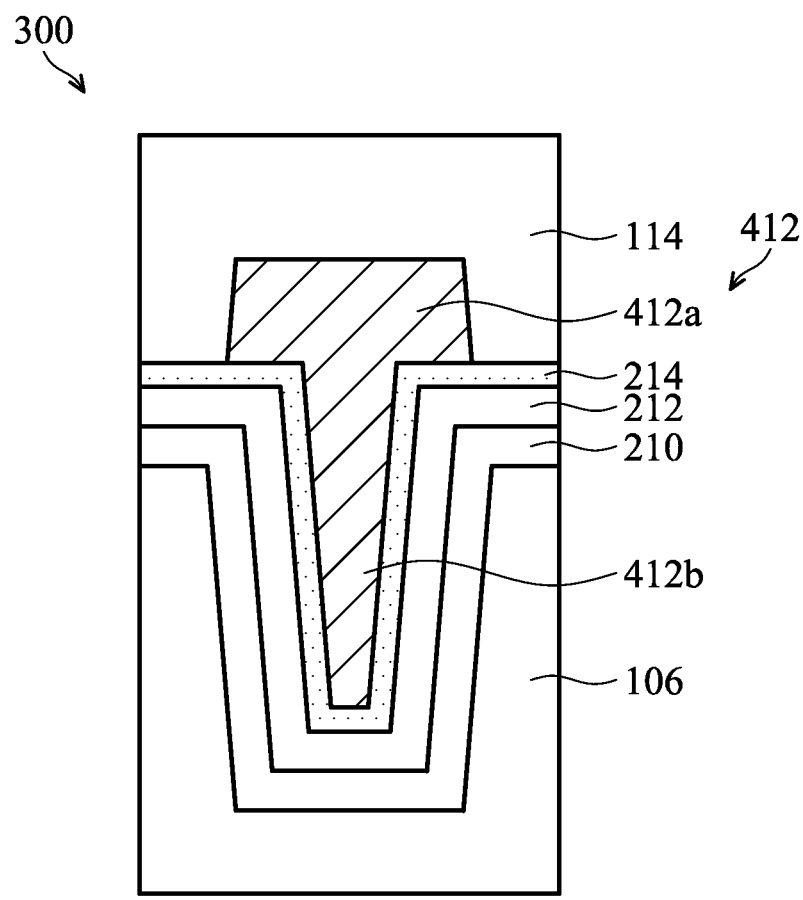

FIG. 5A-5C show cross-sectional representations of forming an image sensor device structure of the region B of FIG. 4, in accordance with some embodiments of the disclosure.

Referring to FIG. 5A, the first insulating layer 210, the second insulating layer 212, the etch stop layer 214 and the metal material 411 are sequentially formed in the trench 203 and on the buffer layer 106. In some embodiments, the etching selectivity of the metal material (formed later) to the etch stop layer 214 is in a range from about 8 to about 15.

It should be noted that when the etch stop layer 214 is formed on the second insulating layer 212, the second insulating layer 212 is protected from being etched. Therefore, the uniformity of the thickness of the second insulating layer 212 is controlled well. In addition, compared with no etch stop layer formed over the second insulating layer 212, the surface roughness of the second insulating layer 212 having etch stop layer 214 formed thereof is relatively low.

After the metal material 411 is formed, a photoresist layer 250 is formed on the metal material 215 as shown in FIG. 5B, in accordance with some embodiments of the disclosure. Afterwards, the photoresist layer 250 is patterned.

After the photoresist layer 250 is patterned, a patterning process is performed on the metal material 411 to form the metal grid structure 412 as shown in FIG. 5C, in accordance with some embodiments of the disclosure.

The metal grid structure 412 has an upper portion 412a above the etch stop layer 214 and a lower portion 412b below the etch stop layer 214. The upper portion of the metal grid structure 412 has a trapezoidal structure. The upper portion 412a of the metal grid structure 412 has an upper surface and a lower surface. The lower surface is substantially level with a top surface of the etch stop layer 214. The width of the lower surface is greater than that of the upper surface. The upper portion 412a and the lower portion 412b are used to define the shape of the upper portion 412a of the metal grid structure 412, and there is no obvious interface between the upper portion 412a and the lower portion 412b.

After the metal grid structure 412 is formed, the dielectric layer 114 is formed on the metal grid structure 412 as shown in FIG. 5C, in accordance with some embodiments of the disclosure.

Compared with the image sensor device structure 200 in FIG. 3I, the image sensor device structure 300 in FIG. 5C has a continuous metal grid structure 412 which is not only formed in the trench structure 203 but also formed over the etch stop layer 214. Therefore, the shielding effect of the metal grid structure 412 is better than a combination of the metal grid structure 222 and the buried metal structure 216.

FIG. 6A-6F show cross-sectional representations of forming an image sensor device structure 400, in accordance with some embodiments of the disclosure.

Figure 6A:
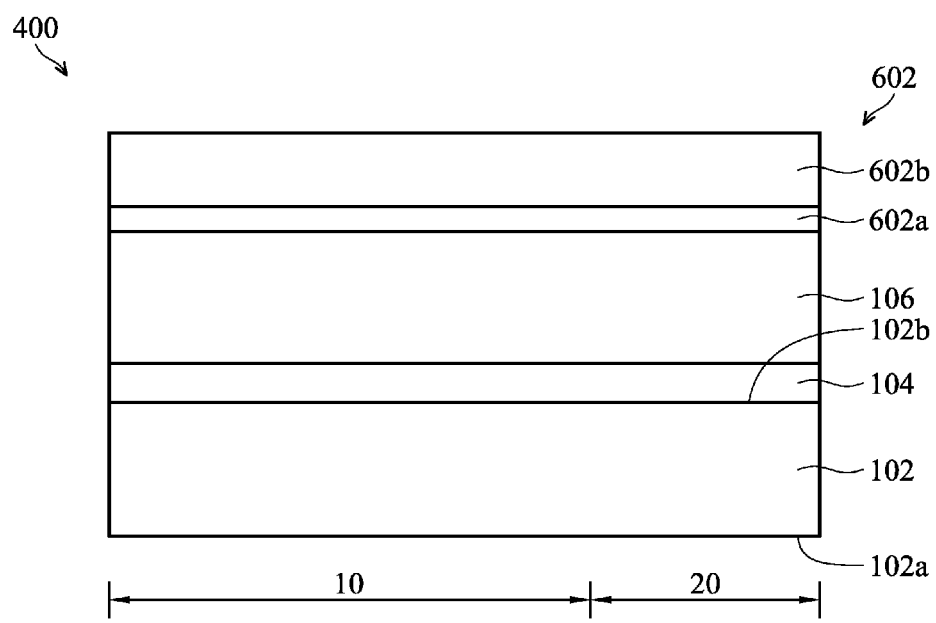
FIG. 6A-6F show cross-sectional representations of forming an image sensor device structure, in accordance with some embodiments of the disclosure.

Referring to FIG. 6A, the substrate 102 is provided. The substrate 102 includes an array region 10 and a peripheral region 20. The array region 10 is also called active image sensor pixel region, and the peripheral region 20 is also called black reference pixel region.

The substrate 102 has a front side 102a and a back side 102b. The anti-reflection (ARC) layer 104 is formed on the back-side 102b of the substrate 102. The buffer layer 106 is formed on the ARC layer 104. A metal structure 602 is formed on the buffer layer 106. The metal structure 602 includes a first metal layer 602a and a second metal layer 602b. The first metal layer 602a is formed on the buffer layer 106, and the second metal layer 602b is formed on the first metal layer 602a. In some embodiments, the first metal layer 602a is made of titanium (Ta), and the second metal layer 602b is made of aluminum copper (AlCu) alloy. In some other embodiments, a single metal layer is formed on the buffer layer 106 in the peripheral region 20.

Figure 6B:
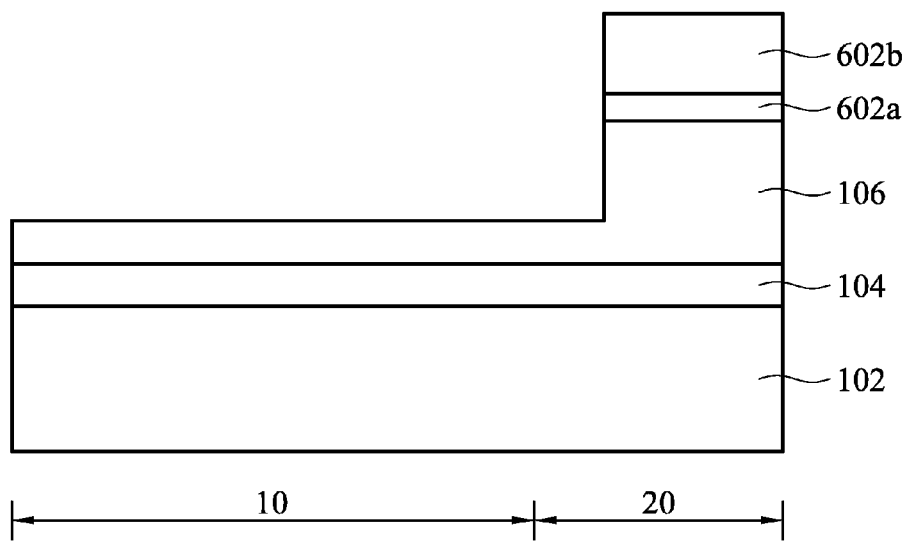

After the second metal layer 602b is formed, a portion of the first metal layer 602a and a portion of the second metal layer 602b are removed as shown in FIG. 6B, in accordance with some embodiments of the disclosure. In addition, a portion of the buffer layer 106 is recessed. The remaining first metal layer 602a and the remaining second metal layer 602b are in the peripheral region 20. The recessed buffer layer 106 is in the array region 10. More specifically, the buffer layer 106 in the array region 10 is lower than the buffer layer 106 in the peripheral region 20.

Figure 6C:
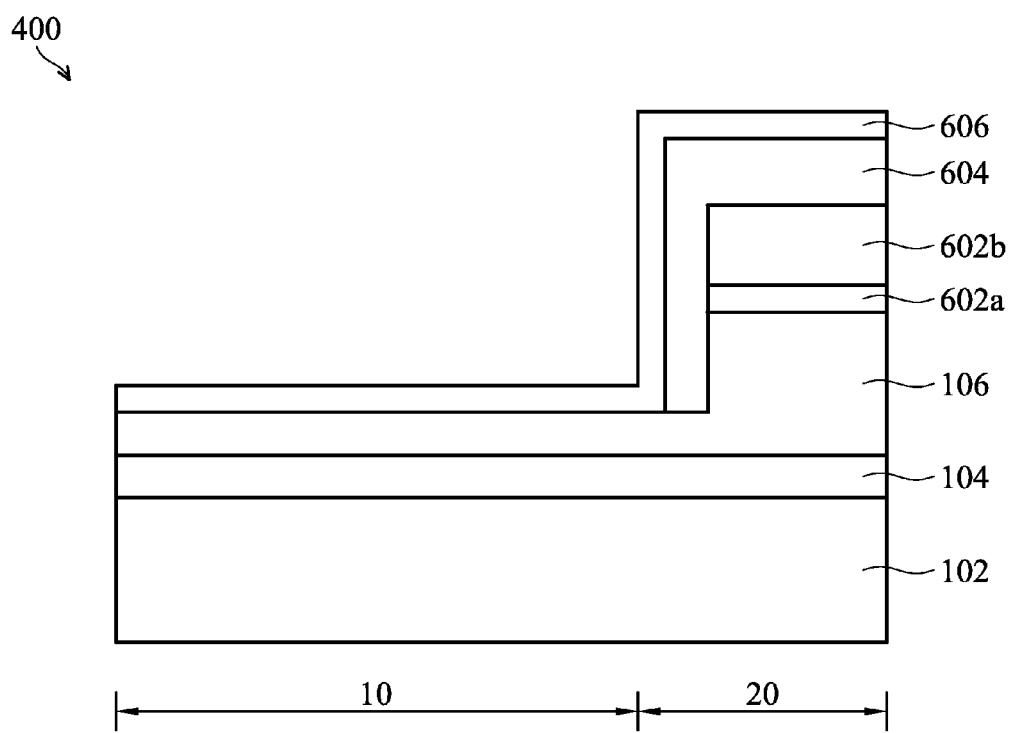

Afterwards, an oxide layer 604 is formed on the remaining first metal layer 602a and the remaining second metal layer 602b as shown in FIG. 6C, in accordance with some embodiments of the disclosure. In some embodiments, the oxide layer 604 and the buffer layer 106 are made of the same material.

Afterwards, a nitride layer 606 is formed on the buffer layer 106 in the array region 10 and on the oxide layer 604 in the peripheral region 20. In some embodiments, the nitride layer 606 is made of nitride, such as silicon nitride (SiN) or silicon oxynitride (SiON).

Figure 6D:
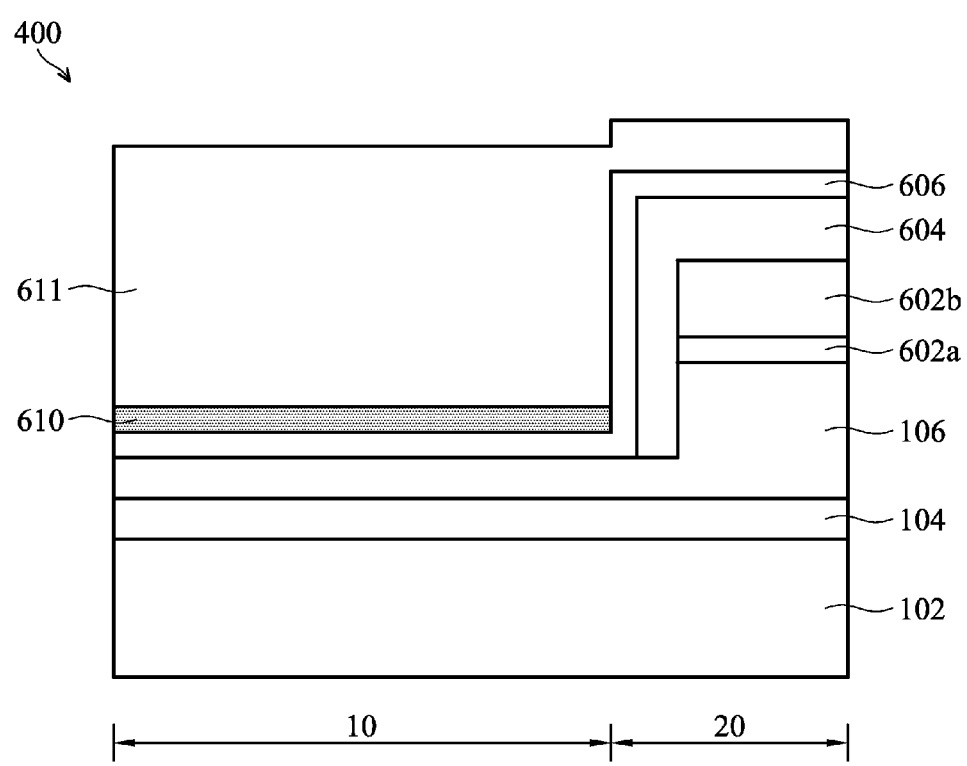

After the nitride layer 606 is formed, an etch stop layer 610 is formed on the nitride layer 606 in the array region 10 as shown in FIG. 6D, in accordance with some embodiments of the disclosure. Afterwards, a dielectric material 611 is formed on the etch stop layer 610 and the nitride layer 606. The etch stop layer 610 is lower than the remaining first metal layer 602a.

If no etch stop layer is formed on the nitride layer 606, the nitride layer 606 should be thick to block the etching process. Since the etch stop layer 610 is formed on the nitride layer 606, the thickness of the nitride layer 606 may be reduced. In some other embodiments, the etch stop layer 606 is omitted.

Figure 6E:
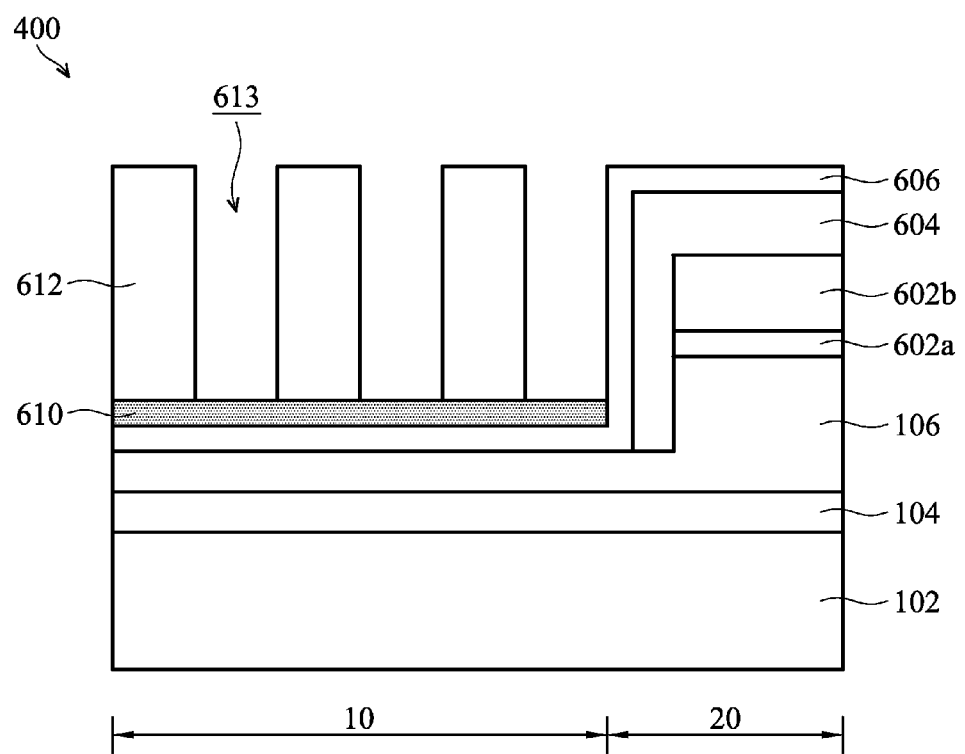

Afterwards, the dielectric material 611 is patterned to form a number of dielectric grid structures 612 as shown in FIG. 6E, in accordance with some embodiments of the disclosure. As a result, a number of trenches 613 between two adjacent dielectric grid structures 612 are formed.

Figure 6F:
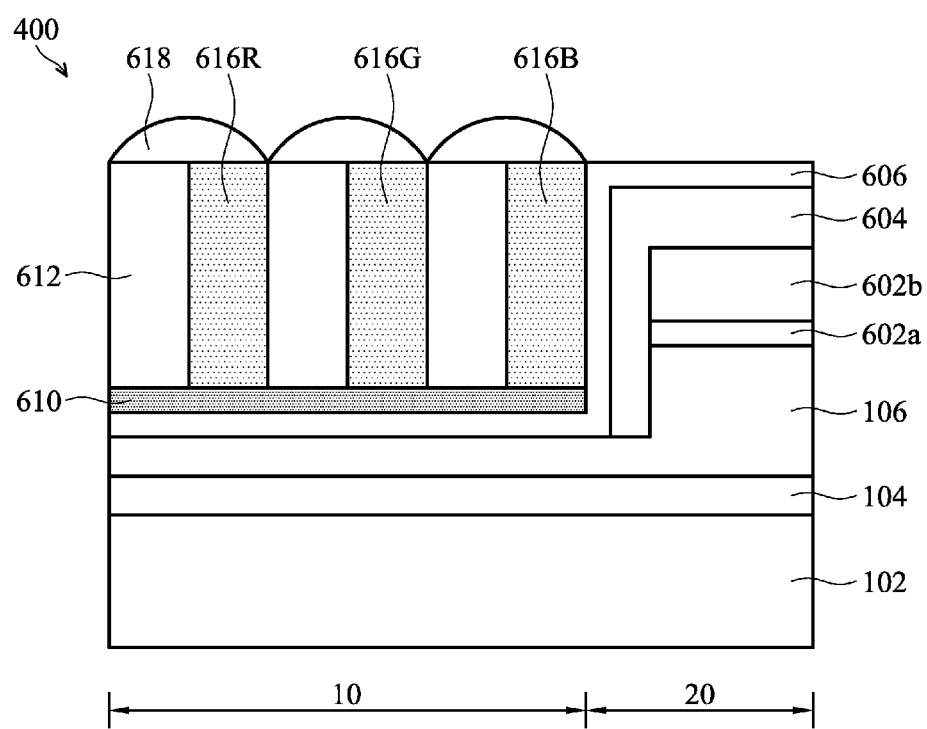

After the dielectric grid structures 612 are formed, the color filters 616R, 616G, 616B are formed in the trenches 613 as shown in FIG. 6F, in accordance with some embodiments of the disclosure. Afterwards, a number of lens structures 618 are formed over the color filters 616R, 616G, 616B.

Embodiments for forming an image sensor device structure are provided. A metal grid structure is formed on a buffer layer on a substrate. An etch stop layer is formed between the metal grid structure and the buffer layer. The etch stop layer is used to protect the underlying layers (such as buffer layer) from being etched. Therefore, the surface roughness of the buffer layer is improved by adding the etch stop layer. In addition, the uniformity of the thickness of the buffer layer is controlled by inserting the etch stop layer. In some embodiments, a buried metal structure is below and aligned with the metal grid structure. In some embodiments, the metal grid structure is formed in a deep trench and extends from the deep trench to above the deep trench. In some other embodiments, the etch stop layer is formed below the dielectric grid structure.

In some embodiments, an image sensor device structure is provided. The image sensor device structure includes a substrate, and the substrate includes an array region and a peripheral region. The image sensor device structure includes an anti-reflection layer formed on the substrate and a buffer layer formed on the anti-reflection layer. The image sensor device structure includes a first etch stop layer formed on the buffer layer and a metal grid structure formed on the first etch stop layer. The image sensor device structure also includes a dielectric layer formed on the metal grid structure.

In some embodiments, an image sensor device structure is provided. The image sensor device structure includes a substrate and an anti-reflection layer formed on the substrate. The image sensor device structure includes a buffer layer formed on the anti-reflection layer, and the buffer layer includes a trench structure. The image sensor device structure includes an etch stop layer formed in the trench and on the buffer layer; and a metal grid structure formed in the trench structure. The metal grid structure extends from the trench structure to above the buffer layer.

In some embodiments, an image sensor device structure is provided. The image sensor device structure includes a substrate, and the substrate includes an array region and a peripheral region. The image sensor device structure includes an anti-reflection layer formed on the substrate and a buffer layer formed on the anti-reflection layer. The buffer layer in the array region is lower than the buffer layer in the peripheral region. The image sensor device structure also includes a metal structure formed on the buffer layer in the peripheral region and an etch stop layer formed on the buffer layer in the array region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device structure, comprising:
a substrate, wherein the substrate comprises an array region and a peripheral region;
an anti-reflection layer formed on the substrate, wherein an entire top surface of the anti-reflection layer formed on the array region of the substrate is planar;
a buffer layer formed on the anti-reflection layer;
a first etch stop layer formed on the buffer layer;
a metal grid structure formed on the first etch stop layer, wherein a bottom surface of the metal grid structure is in direct contact with a top surface of the first etch stop layer;
a dielectric layer formed on the metal grid structure; and
a buried metal structure formed in the buffer layer in the array region, wherein the buried metal structure is below the metal grid structure, and the buried metal structure is electrically insulated from the metal grid structure by an insulating layer.

2. The image sensor device structure as claimed in claim 1, wherein the buried metal structure is covered by the metal grid structure.

3. The image sensor device structure as claimed in claim 1, further comprising:
a second etch stop layer formed in the buffer layer, wherein the buried metal structure is surrounded by the second etch stop layer.

4. The image sensor device structure as claimed in claim 1, further comprising:
a trench structure formed in the buffer layer;
a first insulating layer formed in the trench structure;
a second insulating layer formed on the first insulating layer; and
the second etch stop layer formed on the second insulating layer.

5. The image sensor device structure as claimed in claim 1, further comprising:
a metal shield structure formed on the first etch stop layer in the peripheral region.

6. The image sensor device structure as claimed in claim 1, wherein the first etch stop layer is made of aluminum oxide ($Al_2O_3$), zirconium oxide ($ZrO_2$) or combinations thereof.

7. The image sensor device structure as claimed in claim 1,
wherein the metal grid structure has a planar top surface with a first width and a planar bottom surface with a second width, and the second width is wider than the first width.

8. The device structure as claimed in claim 1, further comprising:
a plurality of color filters formed on the dielectric layer, wherein the metal grid structure is formed below an interface region between two adjacent color filters.

9. The device structure as claimed in claim 1, wherein the substrate has a front side and a back side, the metal grid structure is formed on the back side of the substrate and an interconnect structure is formed on the front side of the substrate.

10. An image sensor device structure, comprising:
a substrate including an array region and a peripheral region;
an anti-reflection layer formed on the substrate, wherein an entire top surface of the anti-reflection layer formed on the array region of the substrate is planar;
a buffer layer formed on the anti-reflection layer, wherein the buffer layer comprises a trench structure;
an etch stop layer including a first portion formed on a bottom surface of the trench structure below a top surface of the buffer layer, and a second portion formed on the top surface of the buffer layer; and
a metal grid structure formed in the trench structure, wherein the metal grid structure extends from the trench structure to above the buffer layer, and a bottom surface of the metal grid structure is in direct contact with the first portion of the etch stop layer.

11. The image sensor device structure as claimed in claim 10, wherein the etch stop layer is made of aluminum oxide ($Al_2O_3$), zirconium oxide ($ZrO_2$), yttrium oxide ($Y_2O_3$) or combinations thereof.

12. The image sensor device structure as claimed in claim 10, further comprising:
a metal shield structure formed on the buffer layer in the peripheral region, wherein the metal shield structure is formed on the etch stop layer.

13. The image sensor device structure as claimed in claim 10, wherein the metal grid structure comprises a top portion and a bottom portion, the top portion is above the etch stop layer and has a trapezoidal structure.

14. The image sensor device structure as claimed in claim 10, further comprising:
a first insulating layer formed in the trench structure;
a second insulating layer formed on the first insulating layer; and
the etch stop layer formed on the second insulating layer.

15. The image sensor device structure as claimed in claim 10, further comprising:
a dielectric layer formed on the metal grid structure; and
a plurality of color filters formed on the dielectric layer, wherein the metal grid structure is formed below an interface region between two adjacent color filters.

16. An image sensor device structure, comprising:
a substrate, wherein the substrate comprises an array region and a peripheral region;
an anti-reflection layer formed on the array region and the peripheral region of the substrate, wherein the anti-reflection layer has a first portion and a second portion, the first portion is on the array region, the second portion is on the peripheral region, and a top surface of the first portion is leveled with a top surface of the second portion;
a buffer layer formed on the anti-reflection layer, wherein the buffer layer in the array region is lower than the buffer layer in the peripheral region;
a plurality of color filters formed over the buffer layer in the array region, wherein a top surface of the buffer layer in the peripheral region is higher than a bottom surface of the color filters;
a metal structure formed on the buffer layer in the peripheral region;
a nitride layer formed on the buffer layer in the array region and the peripheral region, wherein a portion of the nitride layer is in direct contact with the color filter; and
an etch stop layer formed on the buffer layer in the array region, wherein the etch stop layer is between the color filters and the nitride layer, and the etch stop layer is in direct contact with the color filters and the nitride layer.

17. The image sensor device structure as claimed in claim 16, wherein the etch stop layer is made of aluminum oxide ($Al_2O_3$), zirconium oxide ($ZrO_2$), yttrium oxide ($Y_2O_3$) or combinations thereof.

18. The image sensor device structure as claimed in claim 16, further comprising:
   a plurality of dielectric grid structures formed on the etch stop layer, wherein the two adjacent color filters are horizontally separated by the dielectric grid structures.

19. The image sensor device structure as claimed in claim 16,
   wherein the nitride layer has a first portion and a second portion, wherein the first portion is formed below the etch stop layer in the array region and the second portion is formed on the metal structure in the peripheral region, and a top surface of the second portion is leveled with a top surface of the plurality of color filters.

* * * * *